United States Patent
Kolem et al.

[11] Patent Number: 6,034,529
[45] Date of Patent: Mar. 7, 2000

[54] LOCAL ANTENNA FOR AN MR DEVICE

[75] Inventors: Heinrich Kolem, Effeltrich, Germany; Andreas Potthast, Oxon, United Kingdom

[73] Assignee: Siemens Aktiengesellschaft, Munich, Germany

[21] Appl. No.: 09/156,621

[22] Filed: Sep. 18, 1998

[30] Foreign Application Priority Data

Sep. 23, 1997 [DE] Germany .................. 197 41 958

[51] Int. Cl.⁷ .................................................. G01V 3/00
[52] U.S. Cl. .................. 324/318; 324/322; 324/309; 600/411; 600/417
[58] Field of Search ................................. 324/318, 322, 324/309, 307, 300; 600/411, 417, 429, 407

[56] References Cited

U.S. PATENT DOCUMENTS

| 4,691,163 | 9/1987 | Blass et al. . |
| 5,218,964 | 6/1993 | Seloloonen ............................ 324/309 |
| 5,678,549 | 10/1997 | Heywang-Koebrunner et al. . |
| 5,699,800 | 12/1997 | Heywang-Koebrunner . |

FOREIGN PATENT DOCUMENTS 0 374 994  6/1990  European Pat. Off. .

*Primary Examiner*—Christine Oda
*Assistant Examiner*—Brij B. Shrivastav
*Attorney, Agent, or Firm*—Hill & Simpson

[57] ABSTRACT

A local antenna for an MR device contains or carries a marking arrangement that permanently contains a substance that can be detected using MR techniques. The marking arrangement allows the substance to selectively be made visible or not visible in an MR image.

10 Claims, 2 Drawing Sheets

LOCAL ANTENNA FOR AN MR DEVICE

BACKGROUND OF THE INVENTION

1. Field of the Invention

The present invention relates to a local antenna for an MR device with a marker that permanently contains a substance that can be detected by MR technique.

2. Description of the Prior Art

Local antennas are employed in diagnostic MR devices for improvement of the signal-noise ratio, and thus of the image quality. The positioning of the local antennas applied to a patient in MR devices has been undertaken conventionally with the aid of a light-beam localizer which marks a region having a defined or known distance from the isocenter of the imaging region of the MR device. A center of the local antenna is first covered with the line of light generated by the light-beam localizer—e.g. by means of a corresponding positioning on a patient bed or by corresponding positioning of the patient bed with the patient. The patient is subsequently moved with the patient bed by the defined distance into the imaging region. In many MR devices the position detection is limited to a single coordinate direction, namely the coordinate axis of the path of travel of the patient bed. Also, it is impossible therein to communicate the positions of a number of simultaneously utilized local antennas to the MR device. In the simultaneous utilization of a number of local antennas it would be desirable to determine their positions and to identify the local antennas themselves. The positions could then be utilized by the MR device to select that local antenna which has the most optimal signal-noise ratio for a region of interest and which thus delivers the best resolution and imaging.

German OS 43 25 206, corresponding to U.S. Pat. No. 5,678,549, teaches a local antenna of the abovementioned type. The local antenna has a marking means that contains a substance that can be detected using MR technique. The marking means generates visible reference points in the MR image which are then utilized for localizing an anatomical abnormality. At the same time, the marking means itself can be applied as a reference point at a stereotactical auxiliary means for carrying out a biopsy of the diagnostic abnormality. The reference points visible in the MR image are necessary for precise execution, but can also be disadvantageous in other applications.

Particularly in subtraction recordings before and after the administration of a contrast agent, a marking which is imaged equally in the two source or original images would disappear due to the subtractive formation. German OS 44 42 398, corresponding to U.S. Pat. No. 5,699,800, thus describes a device with which the marking means can be selectively filled with various substances that behave differently with respect to MR imaging techniques. Visible markings thus can be generated in subtractive images. A transfusion system must be employed to exchange the substances in the marking means between the two imaging sequences. The transfusion system is relatively expensive due to the required line connections.

SUMMARY OF THE INVENTION

It is an object of the present invention to provide a local antenna for an MR device whose position in the MR device can be detected such that the means required for position detection do not disturb normal imaging sequences and compromise the MR images generated using these sequences. In this context, "normal imaging sequences" means imaging sequences for generating diagnostically meaningful MR images.

The object is inventively achieved in an MR local antenna arrangement which contains or carries a marker substance which can be selectively made to appear or not appear (i.e., be recorded or not recorded) in an MR image. A survey or planning image can be generated with a scout scan prior to the beginning of a diagnostic imaging sequence, with the marker substance appearing in the scout image for localization and possibly for identification of the local antenna. In the actual diagnostic imaging sequence the marker substance generates no disturbing image in the MR image.

In an embodiment the marker substance has a gyromagnetic constant which differs from the gyromagnetic constant of protons. The substance thus can be represented with specific sequences in a survey image; in the actual diagnostic MR image, which illustrates the density of the protons, the substance is not visible.

In a version of this embodiment the gyromagnetic constant of the marker substance differs from the gyromagnetic constant of protons on the order of magnitude of 10%. Due to the low difference between the MR frequency of the marker substance and the proton resonance frequency, it is possible to perform the survey measurement with a conventional MR device that is only slightly modified in the high-frequency portion (in particular, the high frequency transmitter must have the corresponding bandwidth to excite both the marker substance and protons).

In another embodiment the local antenna carries a magnetic field generator which is activatable to selectively generate an auxiliary magnetic field at the location of the marker substance. The magnetic field generator is deactivated in the scout scan; however, it is activated in the diagnostic imaging sequence and makes the marking invisible in the diagnostic MR image due to the locally active magnetic auxiliary gradient field.

In a version of this embodiment, if the magnetic filed generator can generate an auxiliary gradient field which is sufficiently large, then the marking substance can be a substance with a large portion of protons.

In a version of this embodiment the magnetic field generator is constructed as a switchable electromagnetic coil, and that the marking substance is arranged in an interior space of the electromagnetic coil. This exploits the fact that an electromagnetic coil produces the highest magnetic flow density in its interior. The local magnetic field is thus modified at the location which achieves the best efficiency.

If, in addition to a localization (position identification) of the local antenna, the particular local antenna being utilized is also to be identified, in another embodiment the marking substance can be contained in a number of separated chambers. Additional information can thus be coded into the marking arrangement in a manner similar to bar coding methods.

In another embodiment, the marking substance is disposed in the immediate vicinity of the antenna conductor of the local antenna, because the sensitivity of the local antenna is highest at that location.

In another embodiment several local antennas form a local antenna group, the local antenna is having respective marking arrangement which are constructed or coded differently from one another for allowing individual identification of each antenna in a MR image. The MR device can thus make the aforementioned antenna selection.

DESCRIPTION OF THE PREFERRED EMBODIMENTS

Figure 1:
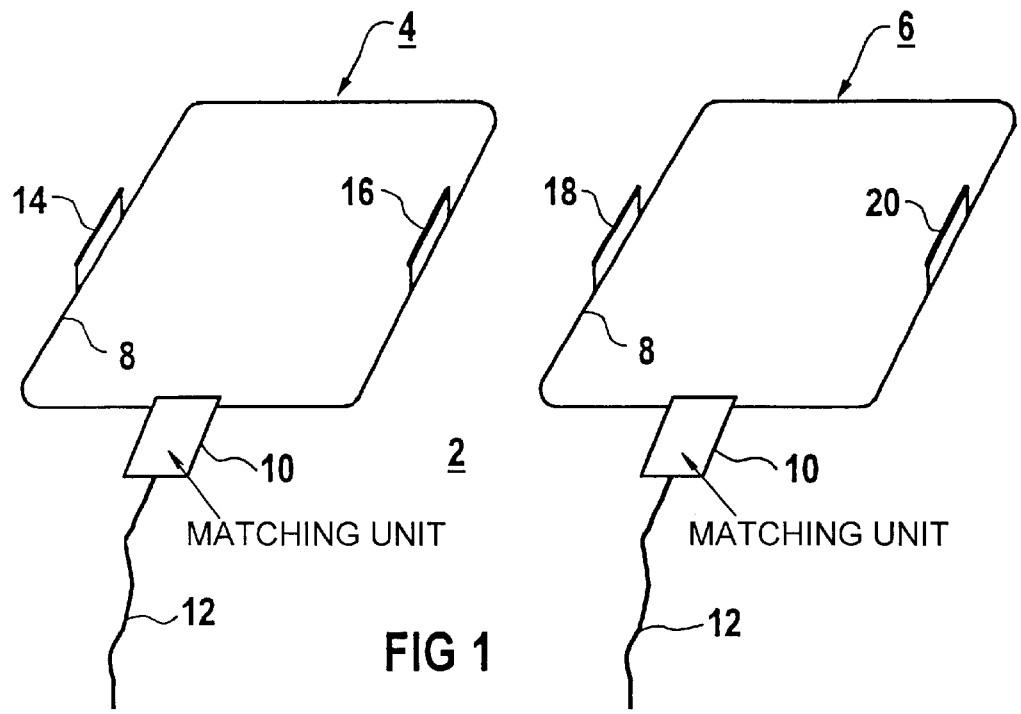
FIG. 1 is a basic illustration of a local antenna array with two antenna elements, including allocated marking arrangement constructed in accordance with the invention.

The antenna group 2 depicted in FIG. 1 includes two similarly constructed individual antennas 4 and 6. Each individual antenna 4 and 6 has an antenna conductor 8 which borders (defines) a rectangular surface and is connected to a signal line 12 via a tuning and matching unit 10. Two marking arrangements 14, 16, or 18, 20, are carried by the antennas 4 and 6, respectively, arranged in the immediate vicinity of the antenna conductor 8. The marking arrangements 14, 16, 18, 20 each contain a substance that can be detected using MR techniques which can be made to produce or not produce a visible contribution in an MR image. In principle the individual antennas 4, 6 can be constructed differently and adapted to different exam regions. In addition, the antenna group 2 can contain other individual antennas of a different type, each having marking arrangements respectively allocated thereto.

Figure 2:
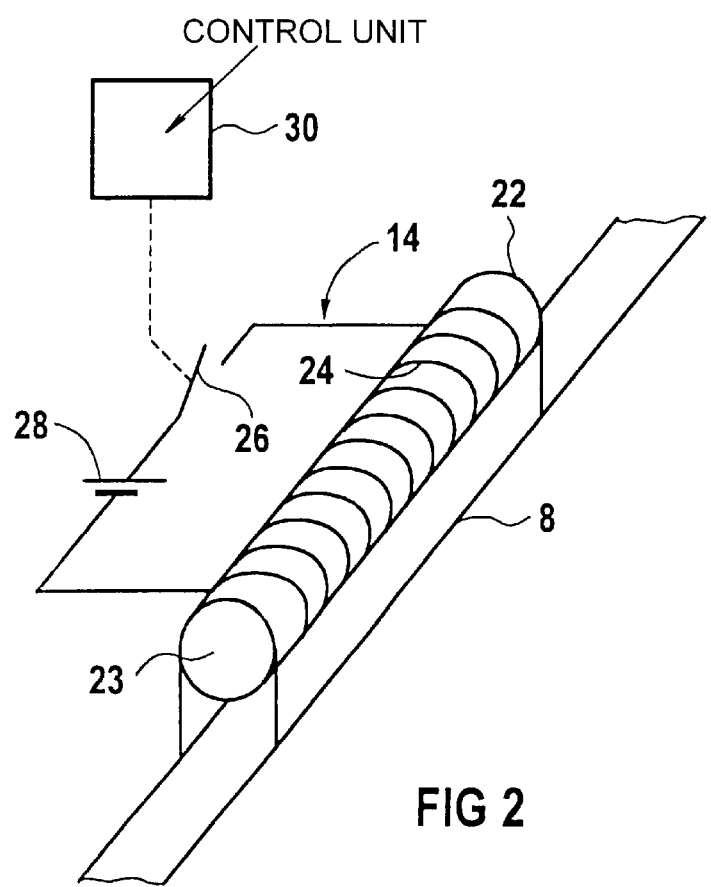
FIG. 2 shows a portion of the local antenna according to FIG. 1 with a marking arrangement shown in more detail.

FIG. 2 shows a portion of either of the individual antennas 4 or 6 with one of the marking arrangements 14, 16, 18 or 20. As representative of all the others, the marking arrangement 14 is depicted which has a closed tube 22 filled with a marker substance 23 with a high proton content—e.g. a saline solution with the composition 1000 g distilled $H_2O$, 1.25 g $NiSO_4 \times 6H_2O$, 5 g NaCl. The tube 22 with the marker substance 23 is arranged in the immediate vicinity of the antenna conductor 8 and parallel thereto. The tube 22 is located in the interior of a solenoidal electromagnetic coil 24 which can be selectively connected to a current source 28 via a controllable switch 26 operated by a control unit 30. In the currentless condition of the electromagnetic coil 24, the tube 22 with the marker substance 23 generates a visible contribution in the MR image. If the switch 26 is closed, the magnetic field at the location of the tube 22 shifts the MR frequency into a range that is no longer detectable, so that the substance 23 is not visible in the magnetic resonance image. The control of this switch 26 occurs by means of a device control unit 30 of the MR device (not further described).

Figure 3:
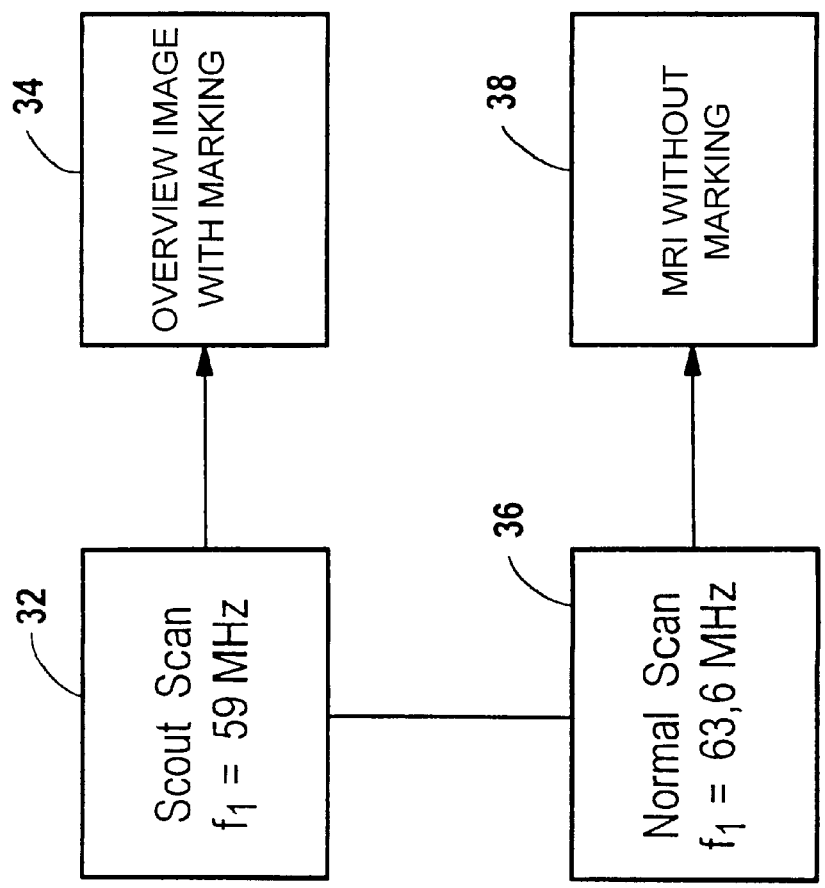
FIG. 3 is a diagram showing differences between two characteristic imaging sequences with which the marking substance can be made to appear or not appear in the MR image, selectively, in accordance with the invention.

The electromagnetic coil 24 with the switch 26 and the corresponding power supply 28 can be omitted if the tube 22 is filled with a substance 26 which has a slightly different gyromagnetic constant from the gyromagnetic constant of protons and which can be detected using MR techniques. For example, if $^{19}$fluorine is used as the marker substance 23, the resonance frequency shifts in comparison to the proton resonance frequency from 63.6 MHz to 59.5 MHz, given a 1.5 T basic magnetic field. Then, as is depicted in the block diagram of FIG. 3, an overview image 34 is created with a scout scan 32, thus making the marking substances of the marking arrangements 14, 16 18, 20 visible. In the scout scan 32, only $^{19}$fluorine is imaged—i.e. an image data set is generated wherein only markings are visible—due to a corresponding excitation with a HF transmitting pulse of e.g. 59 MHz, given a basic magnetic field of 1.5 T. The overview image 34 with the markings of the individual antennas 4 and 6 is evaluated for selection of the most suitable individual antenna for the body region to be examined. A subsequent normal imaging sequence 36 then generates an MR image 38, wherein the markings are invisible, since the substance $^{19}$fluorine does not produce a contribution to the image with the HF magnetic field tuned for proton imaging.

Figure 4:
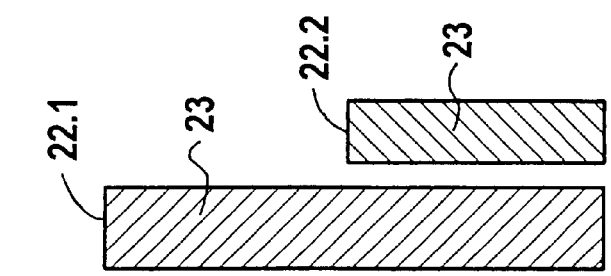
FIG. 4 shows a first embodiment of the marking arrangement of the invention.

FIG. 4 shows two tubes 22.1 and 22.2 with different structural lengths. The tubes 22.1 and 22.2 constitute the marking arrangements 14, 16, 18, 20 when they are filled with $^{19}$fluorine, for example. If they are filled with a substance of high proton density, then they are arranged in the interior of the switchable electromagnetic coil 24, as shown in FIG. 2. Additional information can be communicated from the antenna to the MR device by virtue of the different length. If, for example, the tube 22.1 with the larger structural length is utilized in the marking arrangements 14 and 16, and the tube 22.2 with the smaller structural length is utilized in the marking arrangements 18 and 20, then the MR device can identify the respective antennas 4 and 6, in addition to their positions. If the marking arrangements 14 and 16 have tubes 22 of respectively different lengths, then the orientation of the antenna 2 can also be determined from the overview image 34.

Figure 5:
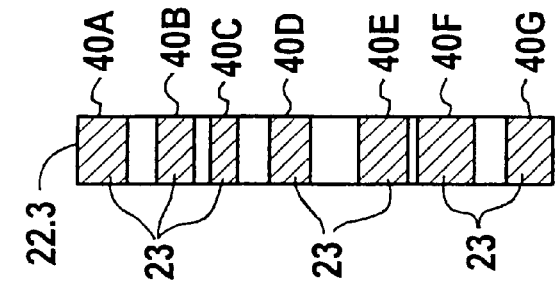
FIG. 5 shows a second embodiment of the marking arrangement of the invention.

FIG. 5 depicts another possibility for coding additional information in a tube 22. The tube 22.3 therein contains different chambers 40A to 40G arranged in succession along the longitudinal direction of the tube. The chambers 40A to 40G are filled with the marking substance 23 and generate respective markings in the MR image 34 that can be distinguished by position and size, and thus provide additional information about the antenna, as in a bar code.

Although modifications and changes may be suggested by those skilled in the art, it is the intention of the inventors to embody within the patent warranted hereon all changes and modifications as reasonably and properly come within the scope of their contribution to the art.

We claim as our invention:

1. A local antenna for a magnetic resonance apparatus, said local antenna comprising:
    an antenna coil; and
    a substance permanently arranged in vicinity of said antenna coil, said substance being detectable by magnetic resonance, and selectively contributing or not contributing to a magnetic resonance image.

2. A local antenna as claimed in claim 1 wherein said substance comprises a substance having a gyromagnetic constant differing from the gyromagnetic constant of protons.

3. A local antenna as claimed in claim 2 wherein said substance has a gyromagnetic constant differing by approximately 10% from the gyromagnetic constant of protons.

4. A local antenna as claimed in claim 1 wherein said substance comprises fluorine.

5. A local antenna as claimed in claim 1 comprising a magnetic field generator carried by said antenna coil for selectively generating an auxiliary magnetic field in which said substance is disposed, said auxiliary magnetic field making said substance invisible in said magnetic resonance image.

6. A local antenna as claimed in claim 5 wherein said magnetic field generator comprises a switchable electromagnetic coil having an interior, and wherein said substance is disposed in said interior of said electromagnetic coil.

7. A local antenna as claimed in claim 1 wherein said substance comprises means for coding unique information into said magnetic resonance image.

8. A local antenna as claimed in claim 7 comprising a plurality of separated chambers, each of said separated chambers containing said substance.

9. A local antenna as claimed in claim 1 wherein said antenna coil comprises a coil conductor, and wherein said substance is carried by said antenna coil immediately adjacent to said coil conductor.

10. A local antenna group comprising a plurality of local antennas, each of said local antennas carrying a substance which selectively contributes or does not contribute to a magnetic resonance image, and wherein each of said antennas comprises means for causing said substance to uniquely identify the antenna carrying the substance so that said plurality of local antennas as distinguishable from each other in said magnetic resonance image.

* * * * *